May 16, 1967 L. SCHWARTZ 3,320,572

ELECTRICAL CONNECTOR ASSEMBLY

Filed Dec. 3, 1964

2 Sheets-Sheet 1

INVENTOR
LEON SCHWARTZ

BY [signature]

AGENT

United States Patent Office 3,320,572

Patented May 16, 1967

3,320,572

ELECTRICAL CONNECTOR ASSEMBLY

Leon Schwartz, Philadelphia, Pa., assignor to Sperry Rand Corporation, New York, N.Y., a corporation of Delaware Filed Dec. 3, 1964, Ser. No. 415,703
8 Claims. (Cl. 339—17)

The invention hereinafter described and claimed has to do with connectors for electrically and mechanically interconnecting electrical circuit elements, but more particularly to push-pull type separable electrical connectors for connecting electrical networks printed or otherwise defined on printed circuit boards, with electrical circuitry external of the printed circuit boards.

Electrical interconnection of circuits on printed circuit boards with external circuitry while having reached a high state of sophistication, still leaves important areas for improvement. For example, newly developed advanced high speed circuitry for computers require printed circuit connectors having a high degree of reliability and an extremely high density (close spacing) of connections in order to accommodate the multiple circuit elements now being jammed on such boards by reason of component miniaturization. This requirement necessitates a degree of connector miniaturization difficult to acquire without sacrifice of reliability and ease of making and breaking the interconnection.

The present invention has as its primary object to provide an improved electrical connector assembly fulfilling the needs described above, and featured by: its reliability; its novel construction affording assembly in high density arrays; its medium insertion and extraction (push-pull) forces; its self alignment of mating parts; its low contact resistance; and the easy removal and replacement of defective elements of the assembly.

In accordance with the above, and first briefly described, the invention comprises a pin or stud, rectangular in cross-section, for mounting on a back-board wiring plane in position to engage a mating socket mounted within an enlarged bore so that it can "float" in a circuit connector block secured along one edge of a printed circuit board. Each socket has a tail portion soldered or otherwise connected to circuit elements on the board. The mating pin and socket assembly is of a size permitting assembly in high density multiple arrays, while the floating female socket provides a wide latitude of tolerance in pin alignment without sacrifice of reliability.

Figures 1, 2, 3:
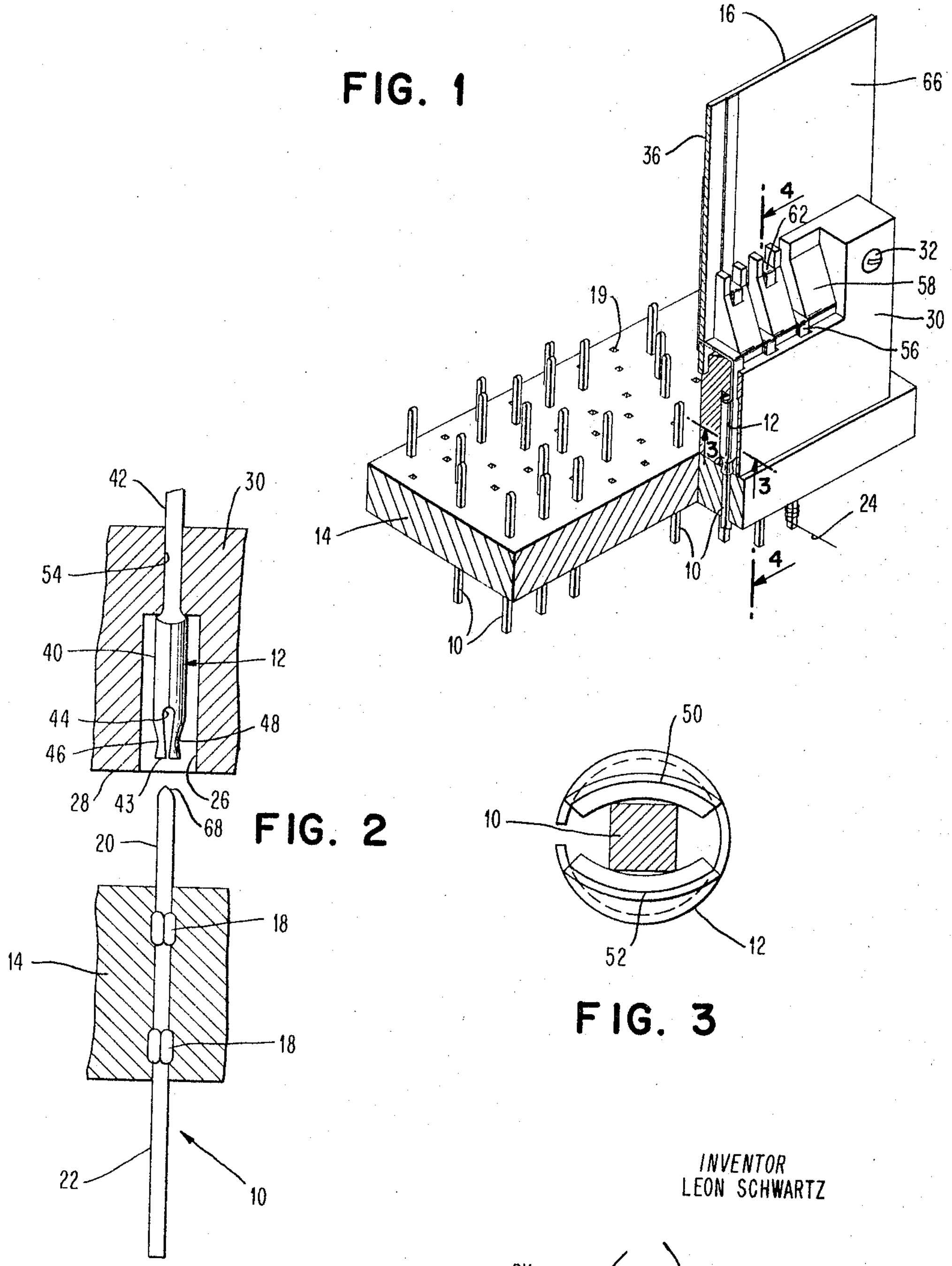
FIGURE 1 is a perspective view of fragmentary portions of a backboard wiring panel and printed circuit board assembly mounted thereon by means of connector assemblies in accordance with the present invention.
FIGURE 2 is an exploded elevational view of elements of a connector assembly.
FIGURE 3 is a sectional view taken along line 3—3 of FIGURE 1.

With particular attention now to the various details of the drawing and first to FIGURE 2, it is seen that basic elements of the connector assembly, in accordance with this illustrated preferred embodiment of the invention, comprises the stud or pin 10 and the socket 12, both made of electrically conductive material.

Normally, as seen in FIGURE 1, a plurality of the pins 10 would be arranged in closely spaced pairs of columns in the backboard 14 whereby a number of printed circuit boards 16 may be closely assembled thereon. The pins in the columns of each pair of columns are staggered relative to each other in a balanced zig-zag path. That is: each pin in one column is equidistant from the two nearest pins in the other column.

Each pin 10 is rectangular in cross section, preferably square, as shown in FIGURE 3, and is provided with spaced pinched projections 18 along its length (FIGURE 2) to retain it against accidental displacement from its position in backboard 14. Preferably, the pins are made of Phosphor bronze.

The pins may be molded in place, but it is preferred that the backboard be pre-formed with square apertures 19 (FIGURE 1) through which the pins will be forced for tight fit. Projections 18 dig into the side walls of the apertures to hold the pins in place. End portions 20 and 22 extend from opposite sides of the backboard for connection with the sockets 12 on one side and for wire wrap attachment, on the other side, of wires 24 from associated electrical equipment or components (not shown). Only one wire 24 has been shown in FIGURE 1 by way of example.

The sockets 12 are mounted in bores or apertures 26 in the bottom wall 28 of a board connector block 30 secured to one edge of the printed circuit board 16, as by screws 32 (FIGURE 1). The board is mounted with its lower edge seated in a groove 33 and with its outer face 36 substantially flush with the outer face 38 of block 30, thus to afford close mounting of adjacent board assemblies on backboard 14, four in the presently illustrated embodiment. The number and arrangement of sockets in the connector block are the same as the number and arrangement of each pair of pin columns.

As seen in FIGURE 2, the socket 12 is formed from a single stamping of a flexible metal, such as beryllium copper, and with one end portion 40 rolled into cylindrical or tubular shape and its other end forming an elongated tail 42. The lower open end or mouth 43 of the socket is formed with opposing tear-drop slits 44 extending upwardly from its bottom edge, as seen in this figure. These slits divide the end 40 into oppositely facing arcuate resilient fingers 46 and 48 for receiving a pin in electrically conductive relationship. To enhance the electrical conduction between these elements, the opposing walls of the fingers 46 and 48 are dimpled inwardly to an extent presenting arcuate contact ridges 50 and 52 (FIGURE 3) spaced apart a distance less than the thickness of a pin.

Figure 4:
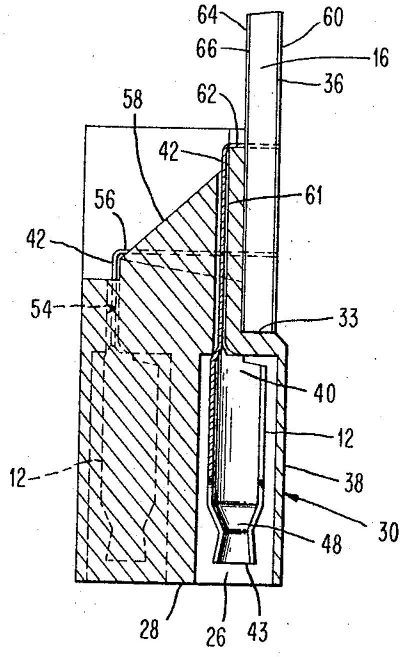
FIGURE 4 is an enlarged sectional view of the connector assembly taken along line 4—4 of FIGURE 1.

In mounting a socket, in its aperture 26, the end of its tail 42 is passed through one of the apertures and a connecting passageway 54 until the socket portion is fully within the aperture, as seen more clearly in FIGURE 4. Each of the apertures is of larger diameter than the cylindrical portion 40 of the socket 12 whereby the socket is afforded a degree of transverse or pivotal motion within its aperture and about its juncture with the tail as a pivot.

In FIGURE 4, it is seen that the upper ends 56 of the tail portion in one column of a pair are bent over between adjacent spacing abutments 58 to extend through the board 16 for solder connection to circuit elements 60 on its outer face. The tails 42 in the other column extend through passageways 61 in the abutments 58 with their upper ends 62 bent over for solder connection to circuit elements 64 on the inner face 66 of the board. Bending of the tail portions where they emerge from passageways 54 and 61 secures the sockets in the bores.

Entry of a pin in its socket, as seen in FIGURE 3, flexes the resilient fingers 46 and 48 slightly apart, thus to effect a tight grip on the pin at all four of its sharp corner edges 67, while sliding of the pin edges over ridges 50 and 52 cleans the contact points. Thus it can be understood that good conductive contact is obtained at each of the multiple contact points for increased reliability.

Figure 5:
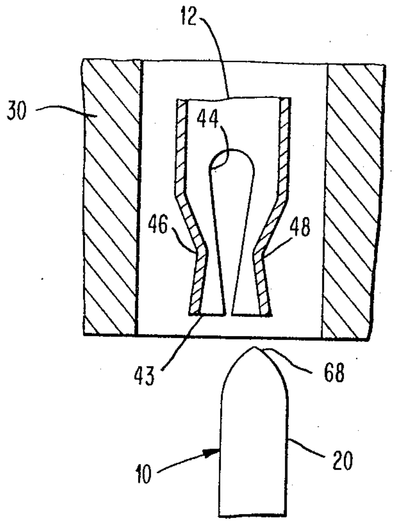
FIGURES 5 and 6 are fragmentary sectional views illustrating the floating socket feature of the invention.
Figure 6:
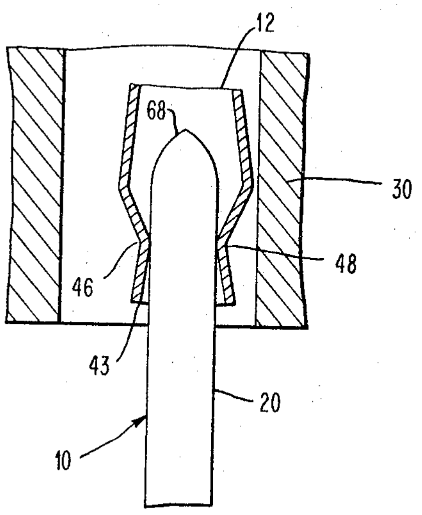

The "floating" mounting of the sockets in the apertures provides tolerance for an ample degree of misalignment of its mating pin. When the board assembly is moved into engagement with the pins with misalignment of socket and pin, it is only necessary that some portion of the bell or funnel-like opening of the socket (FIGURE 5) be aligned with the tapered end 68 of the pin end 20. In such cases, and as seen in FIGURE 6, the socket will be urged to pivot, or "float" over until sufficiently aligned to receive the pin.

Removal of a defective socket from the board assembly is accomplished simply by cutting the tail portion where it emerges from its passageway in the board connector 30. The socket then can be pulled from its aperture, and the remaining tail portion removed by applying a hot soldering iron to its solder connection on the board and pulling it from the abutments 58.

In one practical embodiment of the invention illustrating the high density arrangement of which the invention is capable, the pins were .0250"±.0005" square and mounted in columns on .150" centers. Columns of each pair were spaced .150" apart. With this spacing and the staggered arrangement of pins in each pair of columns, as described above, four pairs of columns can comfortably accommodate 220 pins in a backboard area 4.050" x 1.125", roughly four and one-half square inches. Insertion and extraction forces were in the range of twelve to twenty pounds.

From the above it can now be understood that the connector assembly of this invention provides many unique features not heretofore found in the connector art.

What is claimed is:

1. An electrical connector assembly for attachment to a printed circuit board comprising, a connector block member having a front surface which is adapted to lie in a plane perpendicular to the plane of the circuit board, a bottom surface which is adapted to face the circuit board and a rear surface spaced from the front surface, said front surface having at least first and second superimposed rows of spaced bores formed therein with the bores forming said first row being offset from the bores forming said second row, each of said bores having a rear wall with a narrow opening therein extending to the rear surface of the connector block, said rear surface having a series of slots formed therein arranged so that each slot is aligned with a respective opening associated with the first row of bores while the spaces between the slots form a series of teeth which are aligned with the openings associated with the second row of bores, electrical connector elements mounted in the bores of said block, each of said connector elements having a tail portion extending out the opening of the bore in which it is positioned, the tail portion extending out the openings associated with the first row of bores being bent to lie in the slots formed in the rear surface of the connector block and to extend downward to the bottom surface of the connector block for conductive connection to the circuit board, and the tail portion of the connector elements extending out the openings of the second row of bores being bent down to lie against the respective toothed portion of the rear surface of the connector block and to extend downward to the bottom surface of the connector block for conductive connection to the circuit board.

2. An electrical connector assembly as set forth in claim 1 in which the electrical connector elements are formed from a flexible electrically conductive material and includes a tubular portion completely positioned with a bore with an open outer end adjacent the entrance of said bore, and wherein the diameter of said bore is greater than the tubular portion of the connector to permit pivotal floating movement thereof within the bore about the tail section of the connector as a pivot.

3. An electrical connector assembly for attachment to a printed circuit board comprising, a connector block member having a front surface which is adapted to lie in a plane perpendicular to the plane of the circuit board, a bottom surface which is adapted to face the circuit board and a rear surface spaced from the front surface, said front surface having at least a first row of bores formed therein, each of said bores having a rear wall with a narrow opening therein extending to the rear surface of the connector block, a socket connector element formed of flexible electrically conductive material mounted in each of said bores, each said socket connector elements having a tubular portion positioned within said bores with an open outer end adjacent the entrance of said bore formed by arcuate resilient fingers and a tail portion extending out through the narrow opening formed in the rear wall of said bore, the tail portion of said socket connector elements being bent downwardly over the rear surface of the block to extend beyond the bottom surface of said block for connection to the printed circuit board, a terminal panel, a plurality of electrically conductive terminal pins mounted in said panel in rows corresponding to the bores of said block, said pins being rectangular in cross section and being arranged for insertion in the tubular portion of the respective socket connector elements located in said bores.

4. An electrical connector assembly in accordance with claim 3 wherein: the resilient fingers of said tubular portion of said socket connector element are formed by opposing slits extending axially from its open outer end to points intermediate its ends.

5. An electrical connector assembly according to claim 3 wherein; said resilient fingers are dimpled inwardly to form said open end somewhat bell-shaped and with opposing arcuately shaped ridges spaced inwardly from the open end; the mating end of said pins being tapered to cooperate with said bell-shaped socket opening to guide said pins into said sockets over a wide tolerance of misalignment; and whereby the corners of said rectangular pins wipingly engage the said arcuate ridges of said resilient fingers during insertion thus to effect clean contact points.

6. An electrical connector assembly comprising: a molded electrically insulating elongated connector block having a plurality of closely spaced bores in one surface arranged in a pair of rows in which the bores in one row are spaced in staggered zig-zag relationship to those in the other row, and wherein each bore has a narrow passageway extending from its bottom to an opposite surface of said connector block; a unitary socket connector element of flexible electrically conductive material mounted in each of said bores, each socket connector element having a tubular portion completely positioned within a said bore with an open outer end adjacent the entrance of the said bore, and a tail portion extending through a connecting passageway for connection to electrical circuit element at another surface of said connector block; and wherein the outer end of said tubular portion is formed into a pair of flexible arcuately shaped fingers by opposing slits extending inwardly from opposite sides of the outer end of said tubular portion to points intermediate its ends; said fingers being dimpled radially inwardly to provide internal arcuate ridges and to form said outer open end into bell shape; the diameter of said bore being greater than that of said tubular portion to permit pivotal floating movement thereof within said bore about its connection with said tail portion as a pivot; said tail portion being bent over said opposite surface to lock said socket element in said bore; an electrically insulating terminal panel; a plurality of elongated terminal pins of electrically conductive material mounted in said terminal panel in rows corresponding to those in said connector block and with opposite end portions of said pins extending from opposite sides of said terminal panel for connection on one side to said socket connectors and on the other side to other circuit elements; said pins being rectangular in cross section and of dimensions greater than the distance between contact points on said arcuate ridges on said fingers whereby the corners of said pins when inserted in said sockets spread said fingers and wipe across said ridges to effect a tight clean wiped contact therewith; outer ends of said pins being tapered to cooperate with said bell shaped opening of said socket to guide said pins into said sockets over a wide tolerance in alignment of mating sockets and pins, misaligned sockets being urged to float into alignment by cam action of said bell-shape opening of said sockets and the tapered pin ends.

7. An electrical connector assembly according to claim 6, wherein: that portion of said tail which is bent over said opposite surface is exposed for severance whereby the socket connector element may easily be removed and replaced by another.

8. An electrical connector according to claim 6 and further comprising: a circuit board secured to said connector block; and wherein certain of said bent over tail portions are connected to circuit elements on one side of said board, and others are connected to circuit elements on the other side of said board.

References Cited by the Examiner

UNITED STATES PATENTS

| | | | |
|---|---|---|---|
| 2,595,188 | 4/1952 | Del Camp | 339—17 |
| 2,734,179 | 2/1956 | Levenson | 339—217 |
| 2,757,349 | 7/1956 | Erbal | 339—64 |
| 3,136,591 | 6/1964 | Just et al. | 339—17 |
| 3,209,311 | 9/1965 | Kukla | 339—258 |

MARVIN A. CHAMPION, *Primary Examiner.*

J. H. McGLYNN, *Assistant Examiner.*